(12) United States Patent
Chung et al.

(10) Patent No.: US 6,171,453 B1
(45) Date of Patent: Jan. 9, 2001

(54) ALIGNMENT MARK SHIELDING RING AND METHOD OF USING

(75) Inventors: Chen Fang Chung; Shuang Ming Jeng, both of Hsin-Chu (TW)

(73) Assignee: Taiwan Semiconductor Manufacturing Co., Ltd, Hsin-Chu (TW)

(*) Notice: Under 35 U.S.C. 154(b), the term of this patent shall be extended for 0 days.

(21) Appl. No.: 09/204,414

(22) Filed: Dec. 2, 1998

(51) Int. Cl.[7] .................... C23C 14/34; C23C 16/00; B05C 21/00

(52) U.S. Cl. ................ 204/192.12; 204/192.15; 204/192.17; 204/192.25; 204/298.11; 204/298.15; 118/503; 118/720; 118/721; 118/728

(58) Field of Search ............... 204/192.12, 192.15, 204/192.17, 192.25, 298.11, 298.15; 118/503, 720, 721, 728

(56) References Cited

U.S. PATENT DOCUMENTS

| | | | |
|---|---|---|---|
| 5,228,501 | * 7/1993 | Tepman et al. | 118/728 |
| 5,451,261 | * 9/1995 | Fujii et al. | 118/728 |
| 5,456,756 | * 10/1995 | Ramaswami et al. | 118/721 |
| 5,513,594 | * 5/1996 | McClanahan et al. | 118/503 |

* cited by examiner

Primary Examiner—Rodney McDonald
(74) Attorney, Agent, or Firm—Tung & Associates

(57) ABSTRACT

A mark shielding ring for use in a physical vapor deposition chamber and a method for using such ring are disclosed. The mark shielding ring may be suitably used for shielding alignment marks or any other marks provided on the top surface of a wafer along a peripheral region. The novel mark shielding ring includes an alignment means for mechanically joining a shielding ring to a wafer pedestal on which the ring is positioned. Any up-and-down motion of the wafer pedestal therefore does not change the alignment between the shielding ring and the pedestal and therefore the function of the shielding ring for protecting an alignment mark can be insured.

20 Claims, 5 Drawing Sheets

ALIGNMENT MARK SHIELDING RING AND METHOD OF USING

FIELD OF THE INVENTION

The present invention generally relates to an alignment mark shielding ring and a method of using such ring in a sputter chamber and more particularly, relates to an alignment mark shielding ring for shielding a wafer during a physical vapor deposition process which can be mechanically joined to a wafer pedestal such that any pedestal movement does not alter the position of the shielding ring on the wafer and a method for using such ring.

BACKGROUND OF THE INVENTION

Physical vapor deposition (PVD) is a frequently used processing technique in the manufacture of integrated circuit chips that involves the deposition of a metallic layer on the surface of a silicon wafer. The technique is also known as a sputtering process. In more recently developed advanced semiconductor manufacturing technology, the PVD technique is frequently used to deposit metallic layers such as TiN as anti-reflective coating or barrier layers.

In a typical PVD process, an inert gas such as argon is first ionized in an electrical field producing a plasma of charged gas particles. The particles are then attracted toward a negatively charged source (or target). The energy of these gas particles physically dislodges, or sputters of atoms of the metallic target material. PVD is a versatile technique in that many different materials can be deposited by using an RF or a DC power source.

In a typical PVD process chamber 10, as shown in FIG. 1, major components of the chamber include a stainless steel chamber body 12 that is vacuum tight and is equipped with a pump 16 capable of reducing the chamber pressure to at least $10^{-6}$ m Torr, a pressure gauge 18, a sputter source or target 20, a power supply (not shown), a wafer holder 14 and a clamp ring 22. The sputter source 20 and the wafer holder 14 are positioned facing each other. The target may be a titanium disc when sputtering of TiN is desired. One of such PVD process chamber is commercially available as Endura® 5500 from Applied Materials, Inc. of Santa Clara, Calif.

The wafer holder 14 is normally a pedestal of a disc shape. In a top surface of the pedestal, metal screws 24 are used as pedestal pins for supporting a wafer 26 at the tips of the screws 24. The pedestal pins allow a gap of approximately 1 mm to be maintained between the wafer 26 and the top surface 28 of the pedestal body 14. The distance is necessary such that a subsequently deposited film, for instance, a TiN layer does not glue the wafer to the pedestal surface 28. A thin TiN layer is frequently used on top of an aluminum-copper film layer as an anti-reflective coating for a subsequent lithography process. In a typical PVD deposition process, a plasma cloud 30 is generated by a cascading ionization reaction in which electrons and ion pairs are formed. For instance, when an electron bumps into an argon atom, it forms an argon ion and another electron. The newly formed electron then collides with another argon atom such that a chain reaction or ionization reaction is started. When the electrons bombard the wafer surface, the surface may be charged to a negative voltage higher than 30 volts.

One of the more important components in a sputter chamber is the clamp ring 22 which serves several functions during a sputter process. For instance, one of the functions is to clamp a wafer to a pedestal heater. The clamp ring holds the wafer in place on the pedestal when a positive gas pressure is applied between the heater and the pedestal such that heat can be efficiently conducted from the heater to the wafer. Another function served by the clamp ring is to allow a predetermined flow of argon to leak from under the wafer into the sputter chamber. A clamp ring is constructed in a circular shape with an oriented cut-out to match a wafer's flat side. A hood portion 32 is built into the clamp ring 22 for shadowing purpose to protect the lip of the clamp ring from being coated by the sputtered metal particles. A plane view of the clamp ring 22 and the hood portion 32 of the clamp ring are shown in FIG. 2.

One other function served by the clamp ring 22, and specifically by the hood portion 32 is the shielding of specific area along the edge of a wafer that should not be covered by sputtered metal particles. A typical area is the alignment marks which are scribed onto a top surface of a wafer for alignment in various process machines and onto various wafer platforms. An alignment mark would not be recognizable in a subsequent lithography process if covered by sputtered metals. The protection of an alignment mark from sputtered metal particles is therefore an important step in a sputtering process.

FIGS. 3A and 3B show a conventional physical vapor deposition chamber with a wafer pedestal in a release and in a process position, respectively. The PVD chamber 40 is constructed of a wafer pedestal 42, a clamp ring 44, an upper chamber shield 46 and a lower chamber shield 48 which are enclosed in chamber wall 50. A clamp shield 52 and an adapter plate 54 for mounting the upper shield 46 and the lower shield 48 thereto are further shown in FIGS. 3A and 3B.

A perspective view of the major components in the PVD chamber 40 is shown in FIG. 4. It should be noted that in this conventional construction of a PVD chamber, the clamp ring 44 is not equipped with an extended hood portion for shielding an edge portion of the wafer or for shielding an alignment mark formed on the wafer.

In a modified conventional PVD chamber 60, as shown in FIGS. 5A and 5B, attempts have been made to shield an edge portion of a wafer by an improved clamp ring 64 and to fix the position of the clamp ring in relation to the wafer 26 by alignment pins 66. In this conventional construction, a modified clamp ring 64 which is equipped with an extended hood portion 70 is used to shield an edge portion 72 of the wafer 26. The modified clamp ring 64 is further equipped with alignment pins 66 which are fixed to an edge 74 of the clamp ring 64. Correspondingly located apertures 62 are provided for positioning the alignment pins 66. The alignment pins 66 and the locating apertures 62 are provided such that the locating pins 66 may enter or exit the locating apertures 62 freely when the clamp ring 64 is lifted up by the wafer pedestal 42 away from the apertures or lowered into the apertures. This is shown in FIGS. 5A and 5B in an release and a process position, respectively.

While the alignment pins 66 utilized in the modified conventional PVD chamber 60 assist in the locating of the clamp ring 64 positioned on top of the wafer pedestal 42, the modified clamp ring 64 does not always function properly to shield alignment marks provided on the wafer surface. For instance, during an upward movement of the wafer pedestal 42 by the upward movement of the elevator 76, the clamp ring 64 and its associated alignment pins 66 are no longer held in place by the locating apertures 62 in the lower chamber shield 68, as shown in FIG. 5B. The movement of the wafer pedestal 42 may cause a shift in position of the clamp ring 64 in relation to the wafer pedestal 42 and the wafer 26 placed on top. As a result, the extended hood portions 70 may no longer shield the alignment marks that were placed directly under the hood portions 70. The subsequent metal sputtering process therefore covers up the alignment marks and cause problems in the subsequent processing step.

It is therefore an object of the present invention to provide an alignment mark shielding ring for use in a sputter chamber that does not have the drawbacks or shortcomings of the conventional clamp rings.

It is another object of the present invention to provide an alignment mark shielding ring for use in a sputter chamber that is effective in shielding alignment marks placed on a top surface of a wafer positioned on a wafer pedestal.

It is a further object of the present invention to provide an alignment mark shielding ring for use in a sputter chamber that can be securely mounted onto a wafer pedestal such that the up-and-down motion of the pedestal does not change the position of the shielding ring.

It is another further object of the present invention to provide an alignment mark shielding ring for use in a sputter chamber that is equipped with extended hood portions for shielding an edge portion of a wafer and with alignment pins for connecting to a wafer pedestal.

It is still another object of the present invention to provide an alignment mark shielding ring for use in a sputter chamber wherein the shielding ring is equipped with alignment pins for joining to locating apertures provided in a wafer pedestal for holding the wafer.

It is yet another object of the present invention to provide a wafer pedestal that is equipped with an alignment mark shielding ring for use in a sputter chamber wherein the pedestal may be mechanically joined to the shielding ring by alignment means such that the up-and-down motion of the pedestal does not affect the alignment of the shielding ring with the wafer positioned on top of the pedestal.

It is still another further object of the present invention to provide a method for shielding a mark on a wafer in a sputter chamber by providing a pedestal that is equipped with apertures in an edge portion for joining with alignment pins provided on a mark shielding ring such that a sputtering process can be carried out with an extended hood portion on the ring covering the mark.

SUMMARY OF THE INVENTION

In accordance with the present invention, an alignment mark shielding ring for use in a sputter chamber and a method for using such ring are provided.

In a preferred embodiment, an alignment mark shielding ring for use in a process chamber can be provided which includes a ring having a generally L-shaped cross-section with a first section of the L parallel with a plane of the ring and a second section of the L perpendicular to the plane of the ring, an opening defined by an edge of the first section of the L, the opening has a first diameter smaller than a diameter of a wafer the ring is adapted for shielding, the first section of the L has at least one extended hood portion for shielding at least one alignment mark formed on the wafer, and at least one alignment means for aligning the at least one extended hood portion to the at least one alignment mark, the at least one alignment means joins the ring to a pedestal supporting the wafer such that movement of the pedestal does not affect the alignment.

The at least one alignment means for the alignment mark shielding ring may include at least one first aperture provided in the first section of the L, at least one second aperture provided in an edge portion of the pedestal, and at least one mechanical means for joining the at least one first aperture to the at least one second aperture. The at least one alignment means may further include two first apertures that are provided in the first section of the L and positioned in opposite sections in the ring, two second apertures provided in an edge portion of the pedestal positioned corresponding to the positions of the two first apertures, and two mechanical means for joining the two first apertures to the two second apertures. The at least one alignment means may further include at least one threaded first aperture provided in the first section of the L, at least one second aperture provided in an edge portion of the pedestal, and at least one screw for joining the at least one threaded first aperture to the at least one second aperture.

The alignment mark shielding ring may be a clamp ring for a wafer positioned on a pedestal. The at least one alignment mark may be formed on a peripheral edge of the wafer. The at least one extended hood portion may be integrally formed with the first section of the L for shielding the at least one alignment mark during a sputtering deposition process. The two oppositely positioned extended hood portions may be integrally formed with the first section of the L for shielding two oppositely positioned alignment marks during a sputtering deposition process.

The present invention is further directed to a wafer pedestal equipped with an alignment mark shielding ring for use in a process chamber which includes a pedestal that has a diameter larger than a diameter of a wafer it carries and a top surface for supporting the wafer, the pedestal is operable in an up-and-down motion by an elevator; an alignment mark shielding ring for positioning on the top surface of the pedestal, the ring has an inner peripheral edge defining an opening therein, the opening has a diameter smaller than the diameter of the wafer, the inner peripheral edge of the ring is equipped with at least two hood portions integrally formed with the ring extending inwardly toward a center of the opening adapted for shielding at least two alignment marks situated on an edge of the wafer, and at least two alignment means for aligning the at least two hood portions to the at least two alignment marks by mechanically joining the ring to the pedestal such that any up-and-down motion of the pedestal does not affect the alignment.

The alignment mark shielding ring may further function as a clamp ring. The pedestal moves from a low release position to a high process position without shifting the at least two hood portions away from shielding the at least two alignment marks. The at least two alignment means may include at least two first apertures provided in the inner peripheral edge of the ring, at least two second apertures provided in the edge portion of the pedestal, and at least two mechanical means for joining the at least two first apertures to the at least two second apertures. The at least two alignment means may further include at least two threaded first apertures provided in the inner peripheral edge of the ring, at least two second apertures provided in an edge portion of the pedestal, and at least two screws for joining the at least two threaded first apertures to the at least two second apertures. The process chamber may be a physical vapor deposition chamber.

The present invention is further directed to a method for shielding a mark on a wafer in a sputter chamber which can be carried out by the operating steps of first providing a pedestal equipped with at least one first aperture in an edge portion of the pedestal, then positioning a wafer which has at least one mark formed on a top surface on the pedestal, then positioning a mark shielding ring on top of the wafer and the pedestal, the ring has an inner peripheral edge defining an opening therein, the opening has a diameter smaller than a diameter of the wafer, the inner peripheral edge of the ring is equipped with at least one hood portion extending inwardly toward a center of the opening adapted for shielding the at least one mark on the wafer and at least one second aperture, and then mechanical joining the ring to the pedestal through the at least one first aperture and the at least one second aperture by a mechanical joining means such that the at least one hood portion shields the at least one mark from sputtered particles in the sputter chamber.

The method may further include the step of mechanically joining the ring to the pedestal such that an up-and-down motion of the pedestal does not affect the shielding of the at least one mark from sputtered particles. The method may further include the step of forming the at least one hood portion integrally with the inner peripheral edge of the mark shielding ring. The method may further include the step of joining the ring to the pedestal by using a compression fitting bolt through the at least one first aperture into the at least one second aperture. The method may further include the step of joining the ring to the pedestal by using a screw through the at least one first aperture into the at least one second aperture equipped with threads.

The method may further include the step of providing two first apertures oppositely positioned in the edge portion of the pedestal, two second apertures oppositely positioned in the inner peripheral edge of the ring and two oppositely positioned hood portions extending from the inner peripheral edge of the ring for shielding at least one mark on the wafer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an alignment mark shielding ring for use in a physical vapor deposition chamber which is equipped with alignment means such that it may be mechanically joined to a wafer pedestal on which the shielding ring is installed. The present invention novel shielding ring allows a wafer pedestal to move up-and-down between release and process positions without affecting the alignment between the mark shielding ring and the wafer pedestal. It greatly improves a conventional clamp ring which is either not fixed to a wafer pedestal or fixed to a lower chamber shield such that any movement of the wafer pedestal would shift the position of the clamp ring on top of the wafer pedestal.

The present invention novel self-aligning mark shielding ring can be used in a sputter chamber to shield alignment marks or any other marks provided on the edge of a wafer from sputtered metal particles. An alignment means is provided which includes a guiding system that contains two apertures in an edge portion of a wafer pedestal and two guide pins, or alignment pins attached to the mark shielding ring. Instead of aligning the shielding ring only in a release position as in the conventional design, the present invention novel design is also able to accomplish alignment of the shielding ring to the pedestal when the wafer pedestal is in a process position. The present invention novel shielding ring therefore reduces the tolerance of the alignment mark position, and furthermore, reduces the system down time for calibrating an alignment mark position. The present invention further improves the long term reliability of alignment mark positions after a multiple number of kit change has occurred, since the number of parts matching is greatly reduced.

Figure 6A:
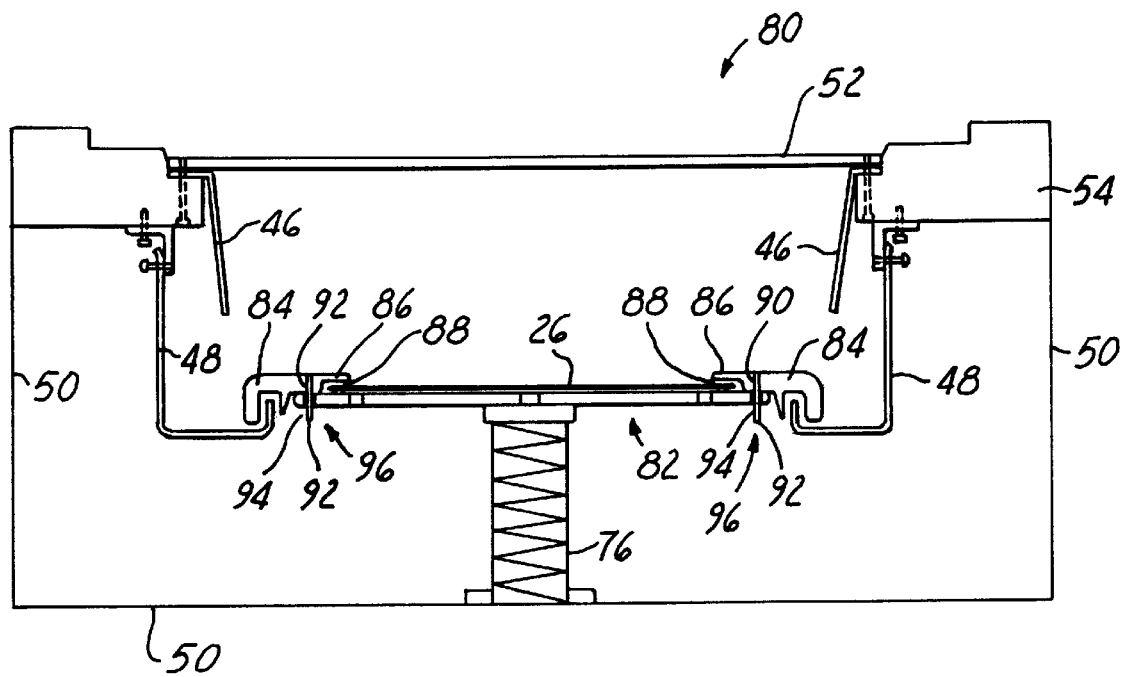
FIG. 6A is an illustration of a cross-sectional view of the present invention physical vapor deposition chamber equipped with a pedestal and a self-aligning mark shielding ring installed on the pedestal.

Referring now to FIG. 6A, wherein an illustration of the present invention physical vapor deposition chamber 80 is shown. The physical vapor deposition chamber 80 is constructed by a wafer pedestal 82, a wafer pedestal elevator 76, an upper chamber shield 46, a clamp shield 52, a lower chamber shield 48, an adapter plate 54 and a mark shielding ring 84. The mark shielding ring 84 further includes an extended hood portion 86 for shielding an alignment mark 88 located on the wafer 26 and a first aperture 90 through the shielding ring 84. A second aperture 94 is provided in an edge of the wafer pedestal 82 such that a mechanical joining means 92 may join the first aperture 90 and the second aperture 94 together for fixing the position of the shielding ring 84 on the wafer pedestal 82. It should be noted that the wafer pedestal 82 is located in a release position as shown in FIG. 6A. The novel alignment means 96 of the present invention therefore includes a first aperture 90, a second aperture 94 and the mechanical joining means 92. It should be noted that at least one alignment means 96 is required, while at least two of such alignment means is preferred for a wafer that is six inch or larger in diameter.

Figure 6B:
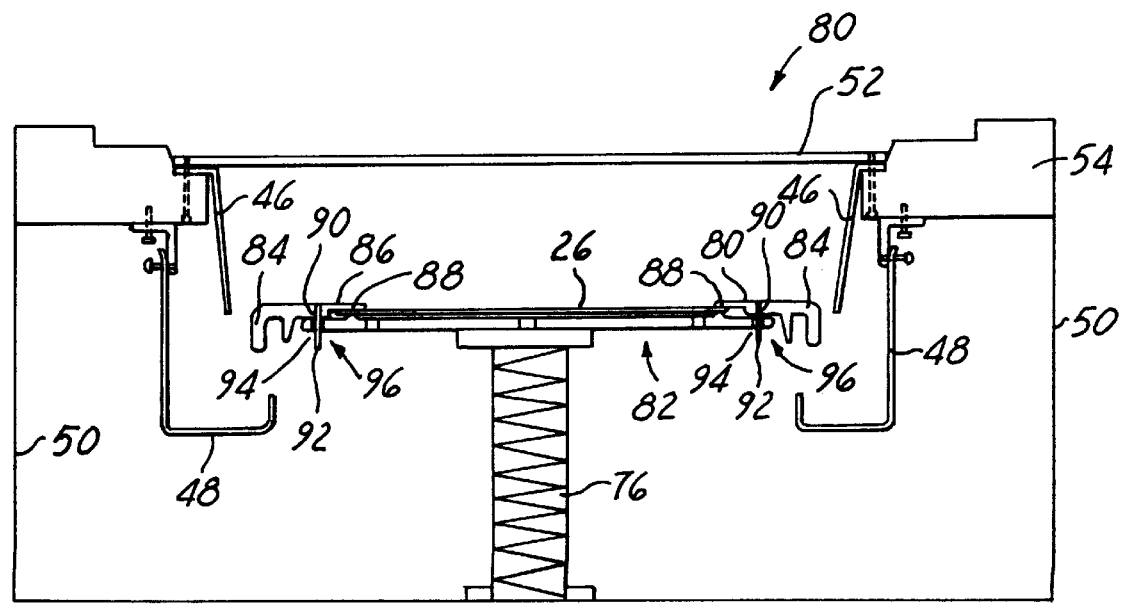
FIG. 6B is an illustration of a cross-sectional view of the present invention physical vapor deposition chamber of FIG. 6A with the pedestal in a process position.

The benefits made possible by the present invention novel alignment mark shielding ring 84 is therefore self-evident by a close inspection of FIGS. 6A and 6B. As shown in FIG. 6B, wherein the wafer pedestal 82 has been raised to a process position by the elevator 76, the relative position of the shielding ring 84 to the wafer pedestal 82 does not change since the two parts are mechanically attached together by the alignment means 96. This is in contrary to the conventional alignment means wherein an alignment pin is attached, instead of to a wafer pedestal, to a lower chamber shield. Such arrangement would not prevent the shielding ring 84 from moving away from its supposed position during an upward movement of the wafer pedestal in the process chamber. Such movement frequently causes the shielding ring to rotate or otherwise shifts away from its supposed position and thus fails its function for shielding a mark on top of the wafer.

Figure 1:
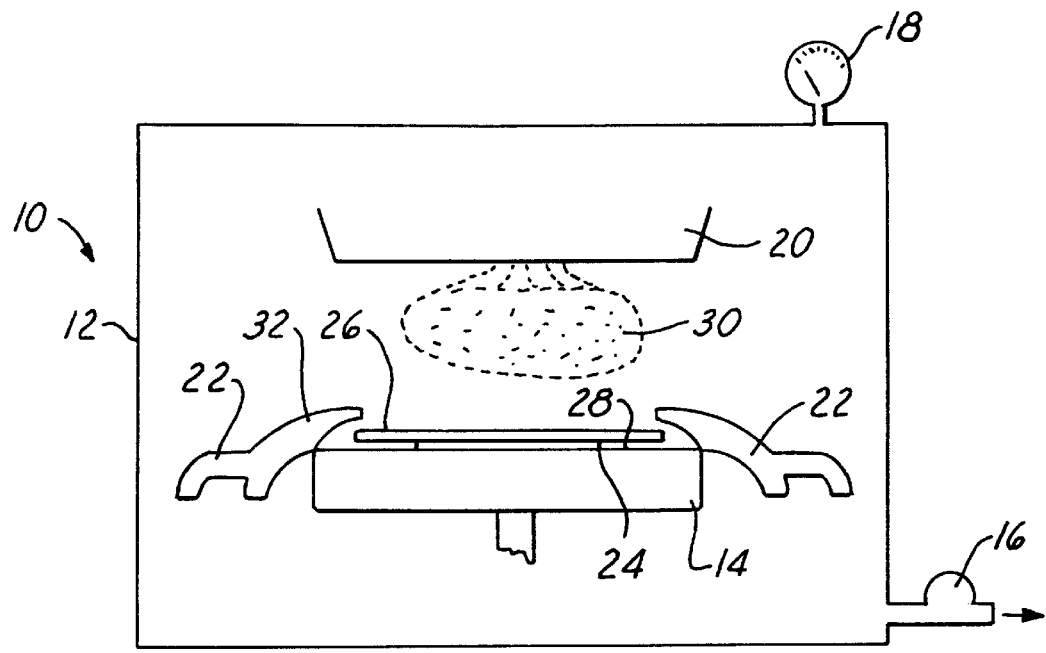
FIG. 1 is a schematic illustrating a conventional physical vapor deposition chamber equipped with a pedestal and a clamp ring.
Figure 2:
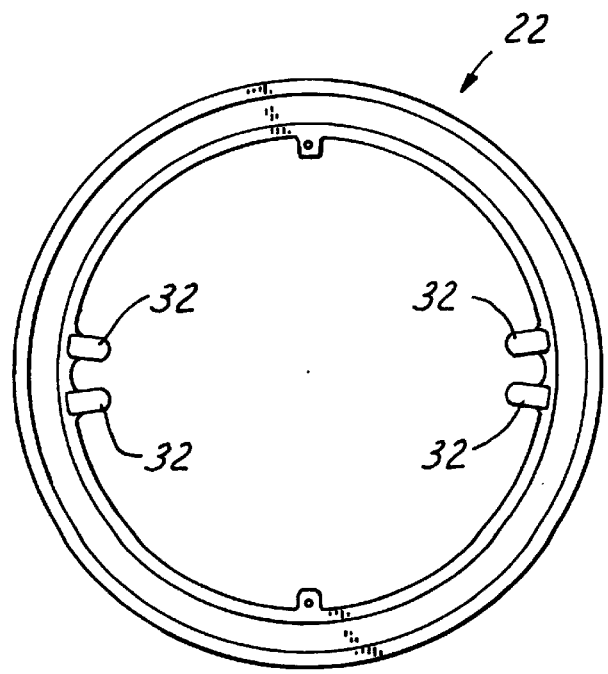
FIG. 2 is a plane view of a conventional clamp ring equipped with extended hood portion for shielding a mark.
Figure 3A:
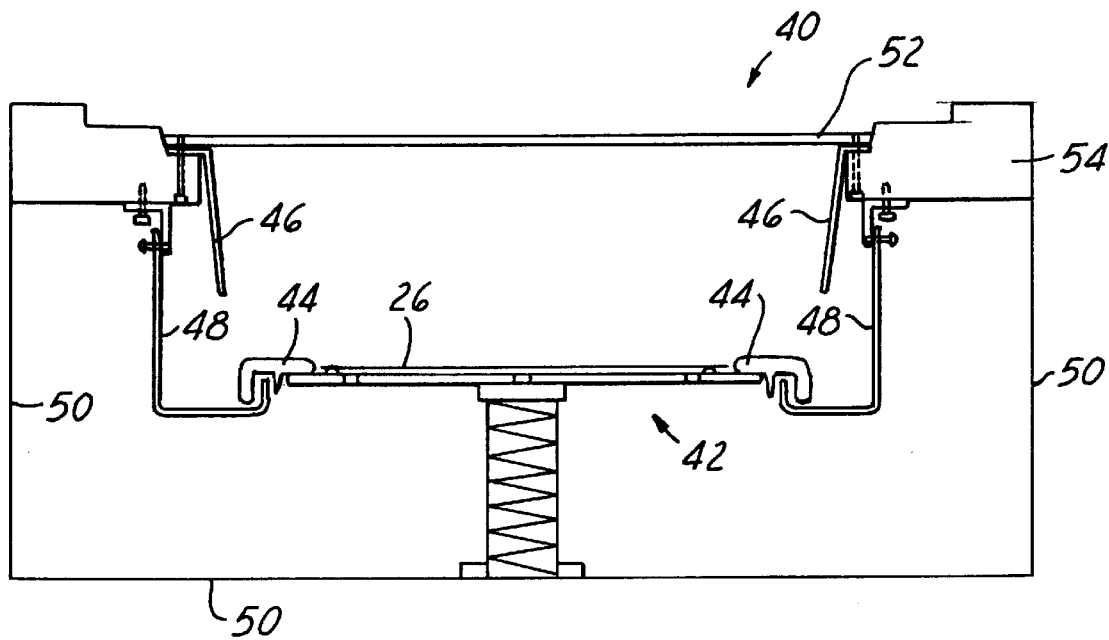
FIG. 3A is an illustration of a cross-sectional view of a conventional physical vapor deposition chamber equipped with a pedestal and a clamp ring.
Figure 3B:
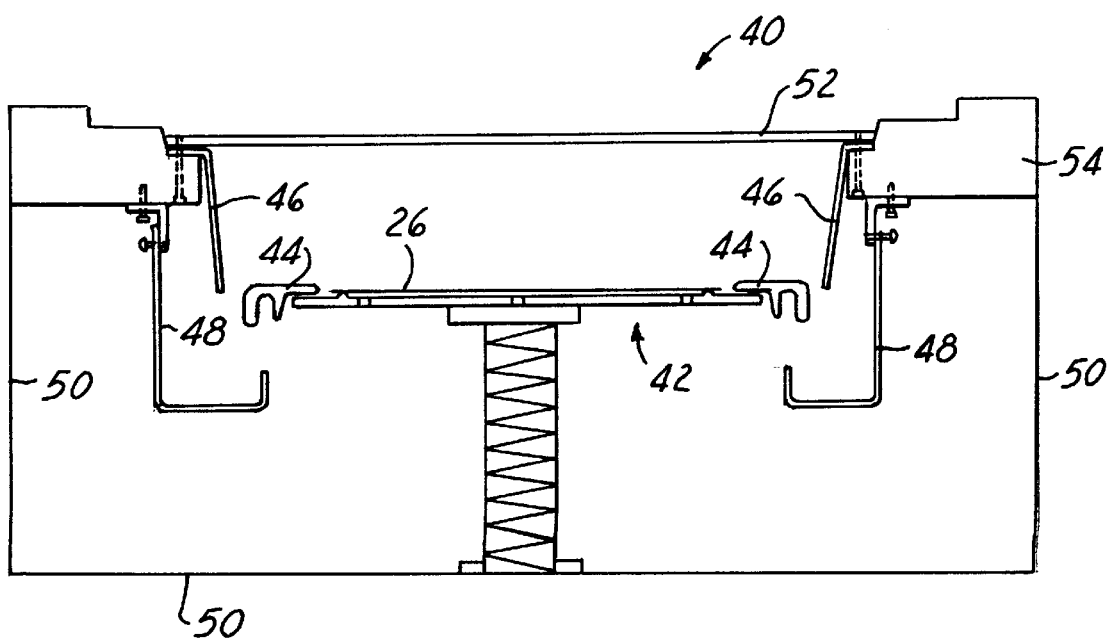
FIG. 3B is an illustration of a cross-sectional view of the physical vapor deposition chamber of FIG. 3A with the pedestal in a process position.
Figure 4:
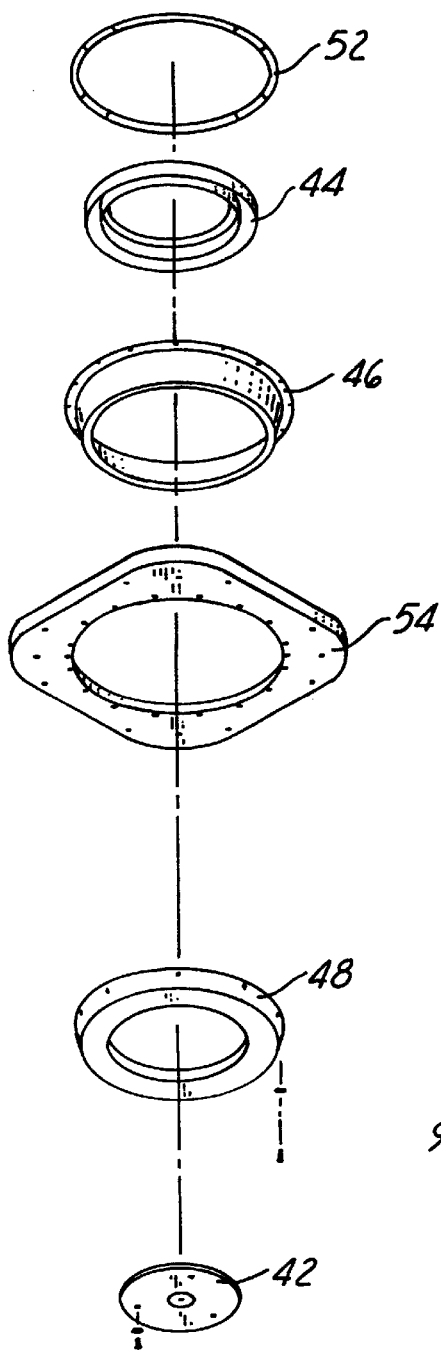
FIG. 4 is a perspective view of the major components in the physical vapor deposition chamber of FIGS. 3A and 3B.
Figure 7:
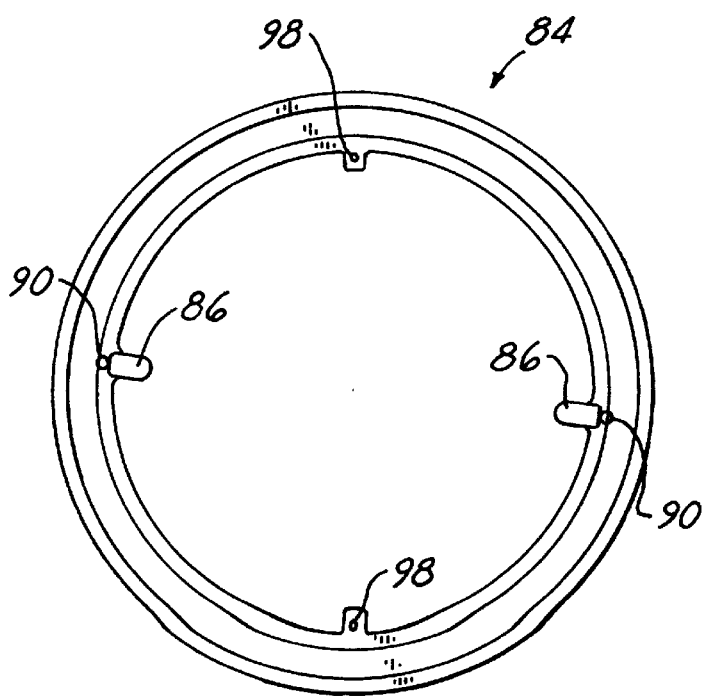
FIG. 7 is a plane view of the present invention mark shielding ring showing extended hood portions and apertures for mechanical joining to a wafer pedestal.
Figure 5A:
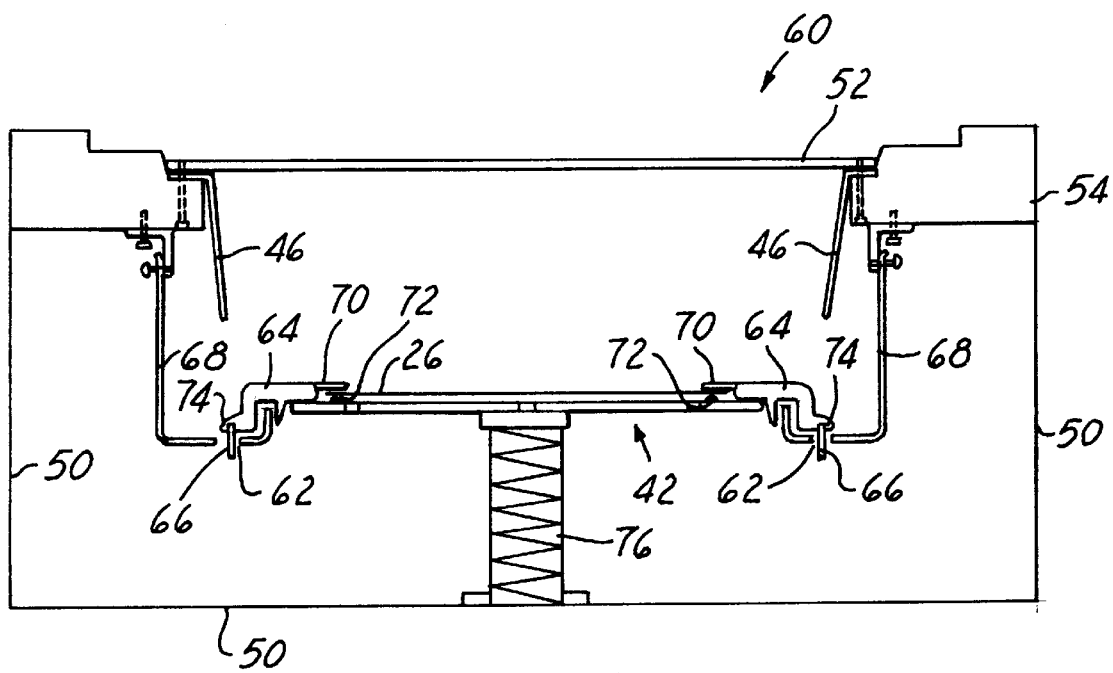
FIG. 5A is an illustration of a cross-sectional view of a conventional physical vapor deposition chamber equipped with a pedestal and an improved clamp ring.
Figure 5B:
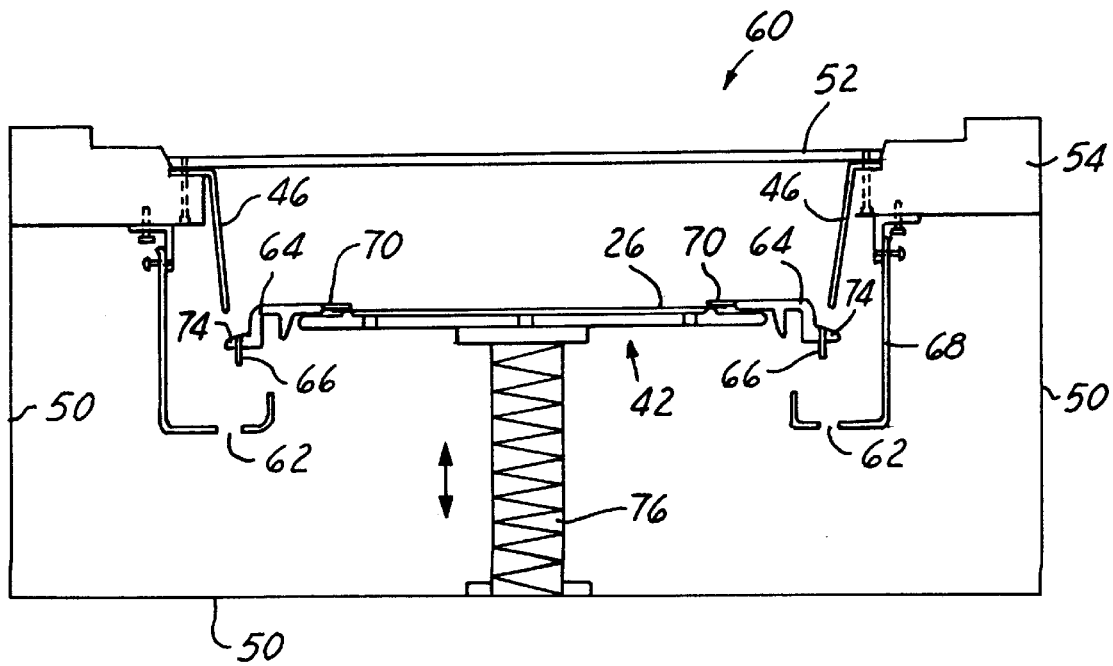
FIG. 5B is an illustration of a cross-sectional view of the conventional physical vapor deposition chamber of FIG. 5A with the pedestal in a process position.

A plane view of the present invention mark shielding ring 84 is shown in FIG. 7. In the mark shielding ring 84, two extended hood portions 86 and two first apertures 90 are provided. The extended hood portions 86 are used for shielding alignment marks placed on the wafer surface, while the first apertures 90 are used for mechanically joining to the wafer pedestal 82 by the alignment means 96. Additional locating tabs 98 are also provided on the mark shielding ring 84. It should be noted that while two extended hood portions 86 are shown in FIG. 7, any number of extended hood portions may be utilized as necessary for shielding alignment marks or any other marks on the top surface of a wafer. The number of the first apertures 90 provided may also be changed to any suitable number as necessary.

The present invention novel mark shielding ring for use in a sputter chamber and a method for using such ring have therefore been amply demonstrated in the above descriptions and in the appended drawings of FIGS. 6A~7. While in the specific illustration, the shielding of alignment marks is shown, the present invention novel shielding ring can be used for shielding any other marks as long as the marks appear in a peripheral region of a wafer.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An alignment mark shielding ring for use in a process chamber comprising:
    a ring having a generally L-shaped cross-section with a first section of the L parallel with a plane of the ring and a second section of the L perpendicular to the plane of the ring,
    an opening defined by an edge of said first section of the L, said opening having a first diameter smaller than a diameter of a wafer said ring being adapted for shielding, said first section of the L having at least one extended hood portion for shielding at least one alignment mark formed on said wafer, and
    at least one alignment means for aligning said at least one extended hood portion to said at least one alignment mark, said at least one alignment means joining said ring to a pedestal supporting said wafer such that movement of said pedestal does not affect said alignment.

2. An alignment mark shielding ring for use in a process chamber according to claim 1, wherein said at least one alignment means comprises:
    at least one first aperture provided in said first section of the L,
    at least one second aperture provided in an edge portion of said pedestal, and
    at least one mechanical means for joining said at least one first aperture to said at least one second aperture.

3. An alignment mark shielding ring for use in a process chamber according to claim 1, wherein said at least one alignment means comprises:
    two first apertures provided in said first section of the L and positioned in opposite sections in said ring,
    two second apertures provided in an edge portion of said pedestal positions corresponding to the positions of said two first apertures, and
    two mechanical means for joining said two first apertures to said two second apertures.

4. An alignment mark shielding ring for use in a process chamber according to claim 1, said at least one alignment means comprises:
    at least one threaded first aperture provided in said first section of the L,
    at least one second aperture provided in an edge portion of said pedestal, and
    at least one screw for joining said at least one threaded first aperture to said at least one second aperture.

5. An alignment mark shielding ring for use in a process chamber according to claim 1, wherein said alignment mark shielding ring is a clamp ring for a wafer position on a pedestal.

6. An alignment mark shielding ring for use in a process chamber according to claim 1, wherein said at least one alignment mark is formed on a peripheral edge of said wafer.

7. An alignment mark shielding ring for use in a process chamber according to claim 1, wherein said at least one extended hood portion is integrally formed with said first section of the L for shielding said at least one alignment mark during a sputtering deposition process.

8. An alignment mark shielding ring for use in a process chamber according to claim 1, wherein two oppositely positioned extended hood portions are integrally formed with said first section of the L for shielding two oppositely-positioned alignment marks during a sputtering deposition process.

9. A wafer pedestal equipped with an alignment mark shielding ring for use in a process chamber comprising:
    a pedestal having a diameter larger than a diameter of a wafer it carries and a top surface for supporting said wafer, said pedestal being operable in an up-and-down motion by an elevator between a release position and a process position,
    an alignment mark shielding ring for positioning on the top surface of said pedestal, said ring having an inner peripheral edge defining an opening therein, said opening having a diameter smaller than the diameter of said wafer,
    said inner peripheral edge of said ring being equipped with at least two hood portions integrally formed with said ring extending inwardly toward a center of said opening adapted for shielding at least two alignment marks situated on an edge of said wafer, and
    at least two alignment means for aligning said at least two hood portions to said at least two alignment marks by mechanically joining said ring to said pedestal such that any up-and-down motion of the pedestal does not affect the alignment.

10. A wafer pedestal equipped with an alignment mark shielding ring for use in a process chamber according to claim 9, wherein said alignment mark shielding ring further functions as a clamp ring.

11. A wafer pedestal equipped with an alignment mark shielding ring for use in a process chamber according to claim 9, wherein said pedestal moves from said release position to said process position without shifting said at least two hood portions away from shielding said at least two alignment marks.

12. A wafer pedestal equipped with an alignment mark shielding ring for use in a process chamber according to claim 9, wherein said at least two alignment means comprises:

at least two first apertures provided in said inner peripheral edge of said ring, at least two second apertures provided in an edge portion of said pedestal, and at least two mechanical means for joining said at least two first apertures to said at least two second apertures.

13. A wafer pedestal equipped with an alignment mark shielding ring for use in a process chamber according to claim 9, wherein said at least two alignment means comprises:

at least two threaded first apertures provided in said inner peripheral edge of said ring, at least two second apertures provided in an edge portion of said pedestal, and at least two screws for joining said at least two threaded first apertures to said at least two second apertures.

14. A wafer pedestal equipped with an alignment mark shielding ring for use in a process chamber according to claim 9, wherein said process chamber is a physical vapor deposition chamber.

15. A method for shielding a mark on a wafer in a sputtering chamber comprising the steps of:

providing a pedestal equipped with at least one first aperture in an edge portion of the pedestal, positioning a wafer having at least one mark formed on a top surface on said pedestal, positioning a mark shielding ring on top of said wafer and said pedestal, said ring having an inner peripheral edge defining an opening therein, said opening having a diameter smaller than a diameter of said wafer, said inner peripheral edge of said ring being equipped with at least one hood portion extending inwardly toward a center of said opening adapted for shielding said at least one mark on said wafer and at least one second aperture, and mechanically joining said ring to said pedestal through said at least one first aperture and said at least one second aperture by a mechanical joining means such that said at least one hood portion shields said at least one mark from sputtered particles in said sputter chamber.

16. A method for shielding a mark on a wafer in a sputter chamber according to claim 15 further comprising the step of mechanically joining said ring to said pedestal such that an up-and-down motion of the pedestal does not affect the shielding of said at least one mark from sputtered particles.

17. A method for shielding a mark on a wafer in a sputter chamber according to claim 15 further comprising the step of forming said at least one hood portion integrally with said inner peripheral edge of said mark shielding ring.

18. A method for shielding a mark on a wafer in a sputter chamber according to claim 15 further comprising the step of joining said ring to said pedestal by using a compression fitted bolt through said at least one first aperture into said at least one second aperture.

19. A method for shielding a mark on a wafer in a sputter chamber according to claim 15 further comprising the step of joining said ring to said pedestal by using a screw through said at least one first aperture into said at least one second aperture equipped with threads.

20. A method for shielding a mark on a wafer in a sputter chamber according to claim 15 further comprising the step of providing two first apertures oppositely positioned in said edge portion of said pedestal, two second apertures oppositely positioned in said inner peripheral edge of said ring, and two oppositely positioned hood portions extending from said inner peripheral edge of said ring for shielding at least one mark on said wafer.

* * * * *